United States Patent [19]

Brunsch et al.

[11] 4,310,798
[45] Jan. 12, 1982

[54] APPARATUS FOR MEASURING MAGNETOSTRICTION CONSTANT

[75] Inventors: Arwed Brunsch, Stuttgart; Wolf D. Ruh, Sommerhofenstr; Jochen Schneider, Gaertringen-Rohrau; Gerhard Trippel, Sindelfingen, all of Fed. Rep. of Germany

[73] Assignee: International Business Machines Corporation, Armonk, N.Y.

[21] Appl. No.: 93,344

[22] Filed: Nov. 13, 1979

[30] Foreign Application Priority Data

Nov. 30, 1978 [DE] Fed. Rep. of Germany ....... 2851771

[51] Int. Cl.³ .................. G01B 7/24; G01R 33/12; G01N 27/72
[52] U.S. Cl. ................................. 324/209; 324/232
[58] Field of Search .............. 324/209, 232, 228; 356/32; 73/659

[56] References Cited

U.S. PATENT DOCUMENTS 2,596,752 5/1952 Williams ............................ 324/209
3,901,074 8/1975 Douglas ............................... 73/657

OTHER PUBLICATIONS

Hoffmann et al., "Measurements of the Magnetostriction Constant of Thin NiFe Films" Z. Agnew Phys. vol. 26, No. 2, 1969 pp. 141-145.

Klokholm, "The Measurment of Magnetostriction in Ferromagnetic Thin Film" IEEE Transaction on Magnetics, vol. MAG-12, No. 6, 1976 pp. 819-821.

Hoekstra et al., "Magnetostriction. . . Coating Field. . ." Rev. Sci. Inst. vol. 48, No. 10, 10-1977, pp. 1253-1255.

Primary Examiner—Gerard R. Strecker
Assistant Examiner—Walter E. Snow
Attorney, Agent, or Firm—Walter J. Madden, Jr.

[57] ABSTRACT

Direct method for measuring the magnetostriction constant $\lambda_s$ of soft magnetic and isotropic magnetic materials. A thin film sample is cantilevered and clamped at one edge. Under the influence of a magnetic AC field and the magnetostriction effect of the sample material, the free end of the cantilevered sample is deflected and oscillates with twice the frequency of the AC field. The resonance amplitude $a_{res}$ is measured by using a laser beam impinging upon the oscillating sample and measuring the reflected beam amplitude by means of a position-sensitive photodiode. The AC output signal of the photodiode is proportional to the sample amplitude. The magnetostriction constant $\lambda_s$ is directly proportional to the resonance amplitude $a_{res}$ multiplied by a constant factor which depends on known geometry and properties of the sample material.

3 Claims, 3 Drawing Figures

APPARATUS FOR MEASURING MAGNETOSTRICTION CONSTANT

FIELD OF THE INVENTION

This invention relates to a method of directly determining and measuring the magnetostriction constant of soft magnetic and isotropic magnetic thin film materials, as well as a device for carrying out said method.

To know the saturation magnetostriction, or the magnetostriction constant, respectively, which are characteristic features of the magnetic material, is of specific importance for the discussion of the magnetic properties of this material, particularly for thin layers of the material.

PRIOR ART

The determination of the magnetostriction constant of thin films is complicated. Examples for measuring methods are given in an article entitled "Die Abhangigkeit der Sattigungsmagnetostriktion von der Legierungszusammensetzung ferromagnetischer Aufdampfschichten", by H. Hoffmann and H. Friedrich, published in Z. angew. Phys., Vol. 26, No. 2, 1969, pp. 141 to 145, and in an article "The Measurement of Magnetostriction in Ferromagnetic Thin Films" by E. Klokholm, published in IEEE Transaction on Magnetics, Vol. MAG-12, No. 6, Nov. 1976, pp. 819 to 821.

In the process according to Hoffmann and Friedrich, very thin mica carriers of approximately 15 μm thickness are used as a substrate. Onto this substrate a ferromagnetic layer in the order of 100 nm is vapor-deposited. Owing to the magnetostriction effect of this thin layer, the carrier bends when the saturation direction of the magnetization is changed in the layer plane. These bends of the carrier are interferometrically determined by its surface profile. The curvature changes of the carrier permit the calculation of the tension changes in the layer, and from that of the magnetostriction constant. Among the disadvantages of this process are the fact that a certain power is required for measurably bending the mica carrier, and that the mica carriers can be prepared only by means of a particularly precise splitting technique. The magnetostriction constant itself is then calculated on the basis of the evaluation of photographs that have been made of these images. On the whole, this is a difficult and intricate method which is furthermore rather complex and time consuming.

In the process according to E. Klokholm, considerations are based on the fact that the application of a magnetic field in parallel to a ferromagnetic film which is applied on one side of a one-sidedly clamped substrate effects a small deflection of the free end. This deflection is measured and the magnetostriction is derived therefrom, since it is proportional to the deflection. For measuring this deflection as a function of the magnetic field strength applied, a glass substrate carrier with one-sided thin film coating is clamped at one end. At the free end opposite the coated side, a fixed plate is arranged which, together with the free end of the sample forms the tuning capacity of an oscillator. The deflection of the free end causes a change of the capacity of this tuning condenser, and thus of the oscillator frequency. This frequency change is determined, and also the sign of the magnetostriction is derived directly from the rise or fall of the oscillator frequency.

This method has the disadvantages that for obtaining a deflection of the free end of the sample that is measurable to some extent, a relatively long substrate carrier is necessary, and that a relatively large or thick layer is required for a measurable deflection. Furthermore, according to the measuring principle that is based on a static deflection of the free end toward, or away from, the stationary plate, the measured quantity strongly depends on vibrations of the entire apparatus, and consequently the result of the measuring process is easily distorted. This measuring principle therefore does not seem appropriate for routine measurings.

SUMMARY OF THE INVENTION

It is the object of the present invention to design the known direct method in such a manner that with simpler means it arrives at better measuring results, particularly with respect to vibrations, and increased measuring sensitivity. Furthermore, a device is to be provided that is particularly suitable for carrying out this method.

In accordance with the present invention, the magnetostriction constant can advantageously be determined in a more precise and less complicated manner, and involving less complex conditions. Thus, a technique is provided for routine measurings which are technically of interest in other contexts and for other purposes.

The method according to this invention, as well as the device for carrying out the method according to this invention will be described below in detail in connection with the embodiment shown in the drawings.

DESCRIPTION OF THE BEST MODE AND INDUSTRIAL APPLICABILITY

Figure 1:
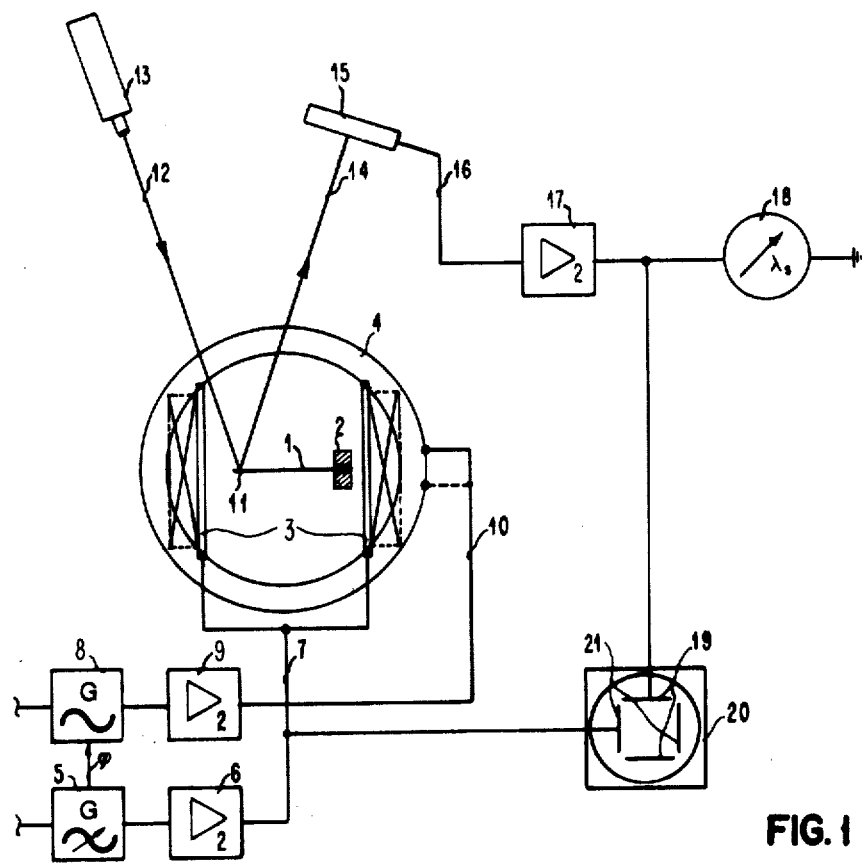
FIG. 1 schematically illustrates the structure of an arrangement for carrying out the method according to the invention.

As shown in FIG. 1, a sample 1 is clamped at one end in a fixture 2. A first pair of Helmholtz coils 3 is arranged around sample 1, and vertically thereto a second pair 4 of Helmholtz coils. Since they are arranged one behind the other, only the front pair is visible in the drawing. The two pairs 3 and 4 are preferably of different size so that they can be positioned as closely as possible to sample 1. The arrangement is such that sample 1 is in the center of both coil pairs.

The first pair 3 of Helmholtz coils is supplied with AC voltage by a generator 5 via a power amplifier 6 and line 7. By an adjustment of the frequency of generator 5, and by an adjustment of the power amplification of amplifier 6, the magnetic AC field generated by pair 3 of Helmholtz coils is adjustable in its frequency and in its strength. The second pair 4 of Helmholtz coils which is to generate a field vertically to the field of coil pair 3 is fed by a generator 8 via a power amplifier 9 and line 10. Generators 5 and 8 are connected via a line marked φ, which is to indicate that generator 5 determines the frequency, that generator 8 equally emits this frequency but in a phase position shifted by φ. This phase shift is preferably 90°.

The two power amplifiers 6 and 9 can also be the two channels of one single power amplifier so that the strength of the field, or of the two fields, generated by pairs 3 and 4 of Helmholtz coils may be altered in value in the same sense.

Through the magnetic field acting on the clamped sample 1, which with a phase shift of 90° between the two generators 5 and 8 is a resulting rotational field, sample 1 is made to vibrate when the layer applied on the glass substrate is magnetostrictive. For determining the vibration of free end 11 of sample 1, beam 12 of a beam source 13, preferably a laser beam from a laser source, is directed thereon. Beam 14 reflected from the surface of sample 1 is evaluated by means of a position-sensitive photodiode 15. Owing to the position of reflected beam 14, photodiode 15 emits a signal on its output line 16 which is an image of the vibration of free end 11 of sample 1. This signal on line 16 which is an AC signal is amplified in an AC amplifier 17, and applied on the one hand for a direct visible display to a display measuring device 18, and on the other for vertical deflection plates 19 of an oscillograph 20. Horizontal plates 21 receive the energizing frequency for the AC magnetic field on line 7.

For correctly capturing light beam 14, position-sensitive photodiode 15 preferably is shiftable in at least two planes that are vertical to each other, as well as vertical to reflected light beam 14. This possible shifting for position-sensitive photodiode 15 is of essential importance also for reaching via a maximum distance for reflected beam 14 a corresponding deflection of the beam at the point of impingement on photodiode 15 so that optical amplification is well utilized in this manner.

Sample 1 clamped in fixture 2 consists of a glass carrier or a glass substrate, respectively which has a thickness in the range of approximately 0.3 to 0.4 mm and whose surface dimensions are approximately 20×20 mm. Onto this glass substrate a thin layer of the magnetic material to be examined is applied on one side, in a layer thickness of approximately some 100 nm. If the magnetic material shows the property of magnetostriction, it expands or contracts when a magnetic field is applied. A magnetic AC field causes a vibration of sample 1 round its clamping point in fixture 2. The frequency of the vibration is twice the frequency of the energizing magnetic field. According to the invention, the frequency of the energizing field is set and selected in such a manner that the sample vibrates at its resonance frequency. The reason for its being selected is that the resonance frequency fully describes the mechanical properties, as the elasticity constant of substrate $E_s$, and the thickness of substrate h.

Under certain conditions, and for a number of specific materials, there exists the following relation between the length alteration $\Delta L/L$ caused by the magnetostriction, and the magnetostriction constant $\lambda_s$:

$$\lambda L/L = -(3/2)\lambda_s(M/M_s)^2 \tag{A}$$

M representing the magnetization in accordance with the field applied, and $M_s$ the saturation magnetization.

The influence of a magnetic AC field onto the one-sidedly clamped sample 1 produces, owing to magnetostriction, a vibration which with small amplitudes can be linearly processed in accordance with the following equation:

$$(d^2y/dt^2) + \gamma(dy/dt) + \omega_o^2 y = f(t) \tag{B}$$

with $\omega_o$ representing the resonance frequency and $\gamma$ the damping of the system, f(t) representing the driving power of the vibration caused by the magnetostrictional effects. Assuming a linear magnetization curve which can be obtained in three ways, i.e. first by applying an AC field in the direction of the hard axis of an isotropic film, second by applying a DC field vertically to an AC field, and third by rotating magnetization through a field of rotation, the following is obtained as a solution for equation (B) when the frequency of the energizing field is much lower than the resonance frequency, for the vibration of the free end of the sample clamped at one side, with length L:

$$y = -\tfrac{1}{2}KL^2 \sin^2\omega_H t \tag{C}$$

with $$K = 9\lambda_s \frac{d}{h^2} \frac{E_F}{E_s}\left(\frac{M}{M_s}\right)^2 \tag{D}$$

with the following applying with respect to constant K:
d is the thickness of the magnetic film to be examined,
h is the substrate thickness,
$E_F$ and $E_s$ are the elasticity constants of the film and of the substrate, respectively.

The solution of equation (B) is a vibration with frequency $\omega = 2\omega_H$, and with the resulting maximum amplitude in connection with a low damping, when $\omega = \omega_o$, i.e. if the entire unit vibrates in resonance. The resulting amplitude then is:

$$a_{res} = (\omega_o KL^2/4\gamma) \tag{E}$$

If equations D and E are combined for calculation of the magnetostriction constant $\lambda_s$, there results:

$$\lambda_s = \frac{4E_s h^2 \gamma}{9E_F L^2 d\omega_o}\left(\frac{M}{M_s}\right)^2 \cdot a_{res} \tag{F}$$

The degree of damping $\gamma$ is determined by the relation:

$$\gamma = 2(\bar{\omega} - \omega_o),$$

$\bar{\omega}$ being given with the amplitude $a_{(\omega)} = 1/\sqrt{2} \cdot a_{res}$.

The elastic constant of substrate $E_s$ can be concluded from the theory of the vibrating plate with suitable borderline conditions for the first harmonic vibration, with one clamped end and one free end in accordance with the equation $$\omega_o = (\kappa L)^2 \frac{h}{L^2}\sqrt{\frac{E_s}{12\rho}} \tag{G}$$

with $(\kappa L) = \pi/(2 + 0.3043) = 1.8751$ being the reflection factor for one clamped and one free end, and $\rho$ representing the density of the substrate.

If $E_s$ is calculated from equation G and introduced into equation F, there finally results for the magnetostriction constant:

$$\lambda_s = 0.4314 \frac{\gamma \omega_o L^2 \rho}{E_F d} \cdot a_{res} \tag{H}$$

For the value of the elasticity constant of film $E_F$, the value known from measurings for bulk materials is used.

In a further simplification, the following equation is obtained for the magnetostriction constant:

$$\lambda_s = K_L \cdot \gamma \cdot \omega_o \cdot a_{res} \quad (I)$$

with $$K_1 = 0.4314 \frac{L^2 \rho}{E_f d}$$

As shown by this equation, magnetostriction constant $\lambda_s$ is proportional to resonance amplitude $a_{res}$. The other factors are substantially determined by the properties and dimensions of the substrate, and should be regarded as constants. When setting the resonance frequency $\omega_o$ and determining the damping factor $\gamma$ which, as a matter of fact, can be considered constant in the use of the same substrates but coated with different magnetic materials, it can be assumed that by reading the resonance amplitude on photodiode 15, or by the direct display on device 18, the magnetostriction constant of different materials but with the same substrates being assumed can easily be determined and is thus displayed directly.

Figure 2:
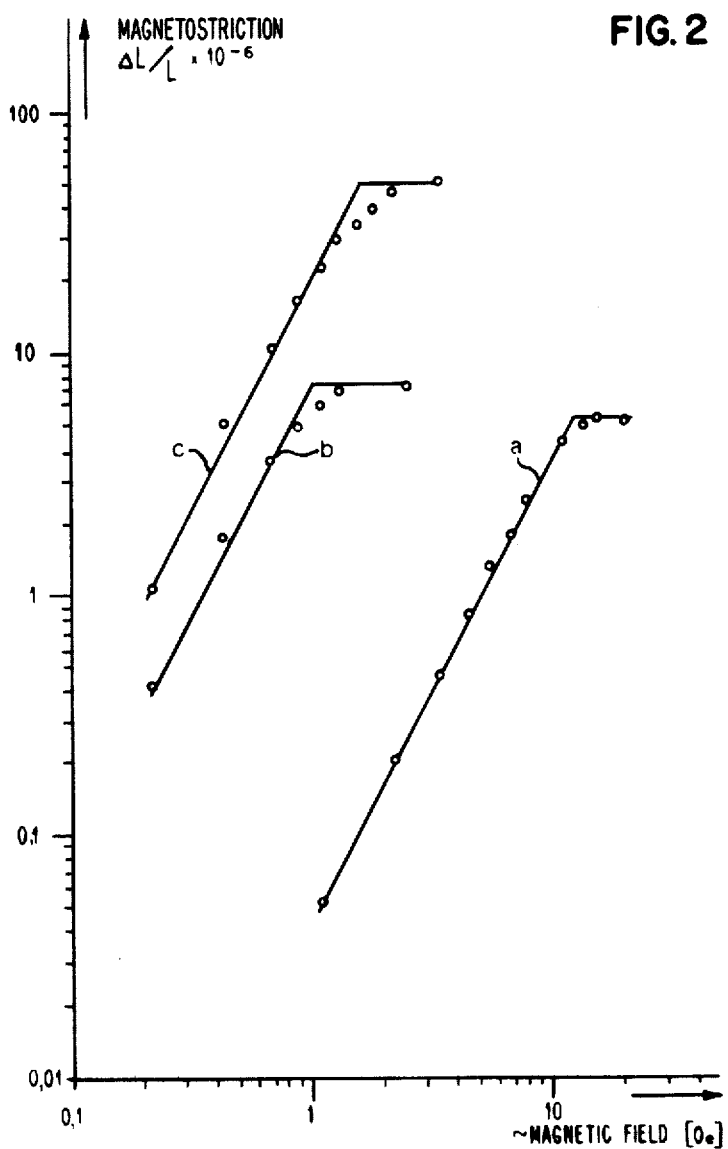
FIG. 2 is a graph in a log-log scale showing the magnetostriction of various samples as a function of the AC magnetic field strength applied, and FIG. 3 schematically illustrates the dependence of the vibration amplitude on the applied frequency of the AC magnetic field.

According to equation A, the change of length $\Delta L/L$ is proportional to $(M/M_s)^2$ owing to the magnetostriction effect. Assuming a linear magnetization curve, a quadratic dependence of magnetostriction $\Delta L/L$ on the magnetic AC field applied is to be expected. FIG. 2 shows in a log-log scale the magnetostriction in accordance with equation A as a function of the applied field strength of the AC field. Both scales are logarithmic. For determining the measuring points shown as small circles, equation H has been used in connection with equation A. The three curves shown follow the quadratic law, with the exception of the saturation vicinity. The deviations from the quadratic dependence are more pronounced in this saturation area, depending on the linearity of the magnetization curves of the individual sample materials. The deviation of curve (a) which applies for amorphous $Co_{74}Fe_6B_{20}$ is small, and this material also shows a highly linear magnetization curve. The magnetization curve of examples (b) and (c) which are amorphous $Fe_{80}B_{20}$ or crystalline $Ni_{80}Fe_{20}$ respectively, are stronger, and the magnetization curves of these samples are less linear than in the sample of the material according to curve (a). The magnetostriction constant of these samples are obtained from the following table:

| Sample | Material | | $\lambda_s$ |
|--------|----------|--|-------------|
| (a) | $Co_{74}Fe_6B_{20}$ | (amorphous) | $3.67 \times 10^{-6}$ |
| (b) | $Fe_{80}B_{20}$ | (amorphous) | $33 \times 10^{-6}$ |
| (c) | $Ni_{80}Fe_{20}$ | (crystalline) | $5 \times 10^{-6}$ |

Figure 3:
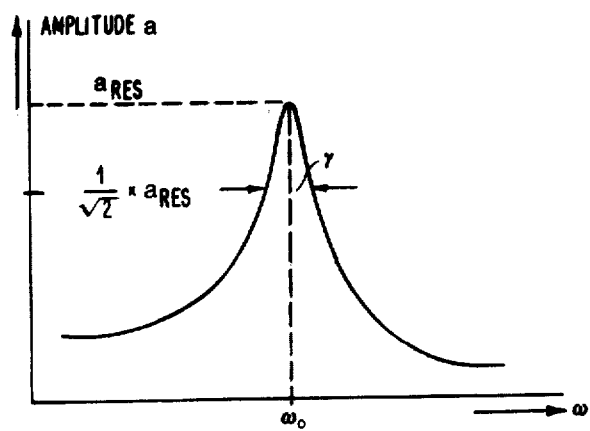

FIG. 3 shows schematically the amplitude as a function of the frequency with which the energizing magnetic field causes sample 1 in FIG. 1 to vibrate. The amplitude of free end 11 of the sample is measured. Through the observation of the curve on oscilloscope 20, the values of interest for equation I, i.e. $\gamma$, $\omega_o$ and $a_{res}$ can be found. By means of generator 5 the resonance frequency $\omega_o$ is set, and the resonance point is found; by means of amplifiers 6 and 9 the magnetic field is raised to a strength required for the saturation of the sample so as to reach in the resonance frequency the maximum resonance amplitude which is shown in FIG. 3 as $a_{res}$. The order of resonance frequency $\omega_o$ is at approximately 700 to 1200 cps when glass substrates in the thickness range of approximately 0.3 to 0.4 mm are used, when the surface dimensions of the glass substrate are $20 \times 20$ mm$^2$, and the effective length L which is made to vibrate amounts to approximately 17 mm.

The sign of the magnetostriction constant can be concluded from a comparison of the phase of vibrating sample 1 and the energizing magnetic AC field.

Owing to the method as disclosed by the invention and the respective device for carrying out the method, magnetostriction constants can be determined with high precision which are smaller by a factor of 100 than those obtained with the Klokholm method. Furthermore, the device according to the invention is substantially insensitive to vibrations owing to the resonance process. The possible AC amplification furthermore presents considerable advantages. All these advantages finally permit a routine measuring of magnetostriction or of the magnetostriction constant by means of the method of this invention, and by its apparatus. This routine measuring provides the opportunity to observe and control material composition, e.g. in a permalloy, in such a manner that the determination of the magnetostriction constant in the quasi-zero area is used for controllably influencing the composition of the alloy so as to produce a permalloy with practically non-existent magnetostriction. Such possibilities are of great importance in the production of thin film heads and other thin magnetic materials.

We claim:

1. Apparatus for determining the magnetostriction constant of soft magnetic and isotropic magnetic thin film materials comprising
    a substrate on which said material is applied,
    said substrate being clamped at one end and capable of being deflected under the influence of a magnetic field;
    means for exposing said material to an AC magnetic field to produce magnetostrictive resonance in said material;
    optical means for measuring the deflection of said material resulting from application of said magnetic field to provide a measure of the magnetostriction constant of said material;
    two pairs of coils for generating said AC magnetic field,
    a first frequency adjustable oscillator whose output is applied to one of said pairs of coils,
    a second oscillator having an input connected to the output of said first oscillator, and having its output connected to the other pair of coils, said second oscillator emitting the same frequency as said first oscillator but with adjustable phase;
    said optical means including a radiation source providing a light beam directed onto the free end of said sample, and
    a position-sensitive photodiode onto which impinges said beam reflected from said sample, the output signal of said photodiode being applied to a device indicating the magnetostriction constant.

2. Apparatus in accordance with claim 1, in which said position-sensitive photodiode is arranged so that it can be shifted in two directions which are vertical to each other and to the direction of the incident beam.

3. Apparatus in accordance with claim 2, including an oscilloscope having a first pair of deflection plates connected to said first oscillator and having a second pair of deflector plates connected to the output of said photodiode.

* * * * *